(12) United States Patent
Huang et al.

(10) Patent No.: US 9,267,988 B2
(45) Date of Patent: Feb. 23, 2016

(54) ON-CHIP EYE DIAGRAM CAPTURE

(71) Applicant: Taiwan Semiconductor Manufacturing Co., Ltd., Hsin-Chu (TW)

(72) Inventors: Wen-Hung Huang, Hsinchu (TW); Chien-Chun Tsai, Jhudong Township (TW); Ying-Yu Hsu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 150 days.

(21) Appl. No.: 13/892,334

(22) Filed: May 13, 2013

(65) Prior Publication Data

US 2014/0266152 A1 Sep. 18, 2014

Related U.S. Application Data

(60) Provisional application No. 61/782,277, filed on Mar. 14, 2013.

(51) Int. Cl.
*G01R 31/317* (2006.01)

(52) U.S. Cl.
CPC .... *G01R 31/31708* (2013.01); *G01R 31/31711* (2013.01)

(58) Field of Classification Search
CPC ............... G01R 31/31708; G01R 31/31711
USPC ...................................................... 324/76.11
See application file for complete search history.

(56) References Cited

U.S. PATENT DOCUMENTS

| 6,256,342 B1* | 7/2001 | Schlag et al. ................ 375/229 |
| 2005/0147194 A1* | 7/2005 | Koenenkamp ................ 375/348 |
| 2010/0201345 A1* | 8/2010 | Gupta et al. ................... 324/96 |

* cited by examiner

*Primary Examiner* — Thomas F Valone
(74) *Attorney, Agent, or Firm* — Duane Morris LLP (57) ABSTRACT

An eye diagram capture device includes a delay line arranged to receive a digital signal and output time delayed version of the digital signal. An edge detection circuit is arranged to receive the digital signal and the time delayed version of the digital signal, the edge detection circuit operating to output a signal corresponding to a logical value of the digital signal received coincident with an edge of the time delay version of the digital signal. A voltage comparator is arranged to receive the digital signal and a reference voltage. The voltage comparator operates to output a first signal when the a voltage of the digital signal and the reference voltage are equal to each other.

18 Claims, 8 Drawing Sheets

ON-CHIP EYE DIAGRAM CAPTURE

CROSS-REFERENCE TO RELATED APPLICATION

This application claims priority from U.S. Provisional Application No. 61/782,277, filed Mar. 14, 2013.

BACKGROUND

This disclosure relates generally to semiconductor testing, and more particularly to eye diagram capture devices, systems, and methods, and even more particularly to an on-chip eye diagram capture device, system and method for a chip-on-wafer-on-substrate (CoWoS) flow.

Eye diagrams provide a useful tool in evaluating the quality of a digital signal. To construct an eye diagram, the digital signal is displayed on an oscilloscope at the signal bit rate, whereby individual instances of the digital waveform are superimposed upon each other. The display has the appearance of an eye. The size and shape of the clear area around the center of the eye provide an indication of the quality of the digital signal.

In three-dimensional integrated circuit (3D-IC) technology, it is sometimes impossible to display eye diagrams using conventional techniques during the wafer stage, since the signal speed is typically too high. Designers need to bond out the high speed IO signals and connect to an oscilloscope in order to display the eye diagram. In 3D-IC technology for CoWoS applications, a wide bus connection may be made available; however, it can be difficult to monitor all the bus eye diagrams due to lack of available controlled collapse chip connection (C4) solder bump resources and limited chip area. In cases where the high speed IO interface can be connected out, such connection may impact high speed IO performance for normal operating modes. If eye diagrams cannot be displayed, the analog performance parameters of the device cannot be fine-tuned to obtain optimum performance for a device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning coupling and the like, such as "connected" and "interconnected," refer to a relationship wherein devices or nodes are in direct or indirect electrical communication, unless expressly described otherwise.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Figure 1:
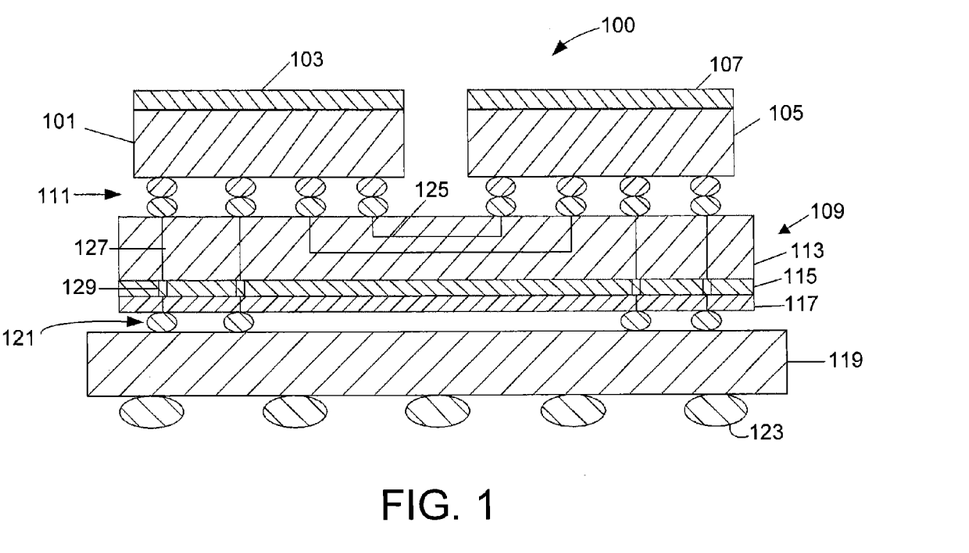
FIG. 1 is a side section view of an on-chip eye diagram capture device in accordance with various embodiments of the present disclosure.

Referring now to the drawing, and first to FIG. 1, a chip-on-wafer-on-substrate (CoWoS) implementation of eye diagram capture device is designated generally by the number 100. Eye diagram capture device 100 includes a first chip 101, including a substrate 103, and second chip 105, including a substrate 107. As will be described in detail hereinafter, chips 101 and 105 include various eye diagram capture circuits and devices.

Chips 101 and 105 are mounted on a wafer 109 by means of a plurality of front-side micro-bumps 111. Wafer 109 includes a silicon interposer 113, a substrate 115, and a backside metal layer 117. Wafer 109 includes the device or devices from which device 100 captures eye diagrams. Wafer 109 is mounted on a package 119 by means of backside micro-bumps 121. A ball grid array (BGA) comprising a plurality of BGA balls 123 is disposed on the backside of package 119.

Chips 101 and 105 communicate with each other through interconnects 125 in silicon interposer 113. Input/output (I/O) is provided to chips 101 and 105 by means of feed through interconnects 127 in silicon interposer 113. Feed through interconnects 127 may be connected to backside micro-bumps by through silicon vias (TSV) 129 in substrate 115 and redistribution layer routing connections through backside metal layer 117.

Figure 2:
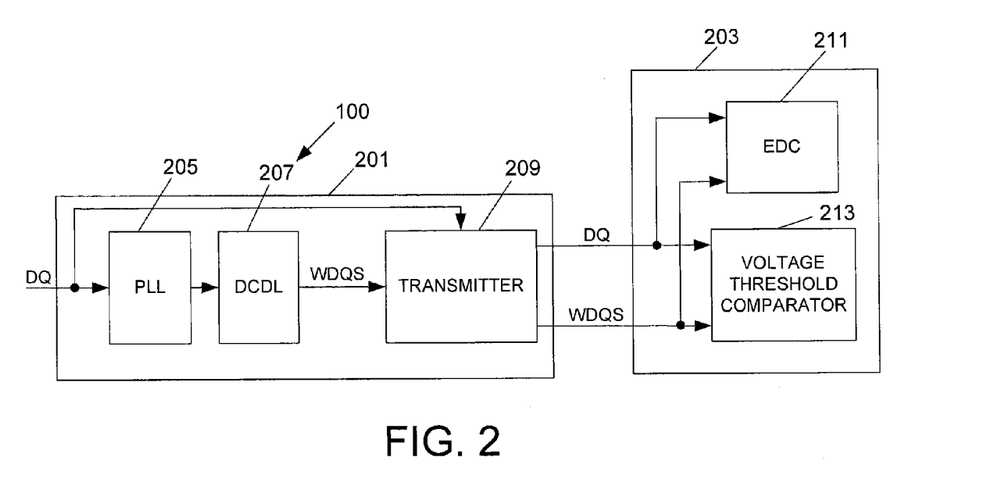
FIG. 2 is a block diagram of an on-chip eye diagram capture device in accordance with various embodiments of the present disclosure.

FIG. 2 illustrates the devices of eye capture device 100. The devices of first chip 101 are included in a first module 201 and the devices of second chip 105 are includes in a second module 203. The devices of first module 201 include a phase-locked loop (PLL) 205, which is connected to receive a digital data bus signal DQ from the device from which an eye diagram is to be captured. The output from PLL 205 is connected to a digitally controlled delay line (DCDL) 207 which, as will be described in detail hereinafter, produces time delayed versions of digital signal DQ which, as will described in detail hereinafter, form clock signals WDQS used in capture eye diagrams. Time-delayed digital signals WDQS from DCDL 207 are provided to a transmitter 209. Original data bus digital signal DQ is also provided to transmitter 209.

Second module 203 includes an edge detection circuit (EDC) 211 and a voltage threshold comparator (VTC) 213. EDC 211 and VTC 213 each receive data bus digital signal DQ and time-delayed clock signal WDQS. As will be described in detail hereinafter, EDC 211 is clocked by signal WDQS to capture logic values of digital signal DQ, which are processed to determine eye width. VTC 213 is operated according to clock signal WDQS to capture voltages of digital signal DQ, which are processed to determine eye height.

Figure 3:
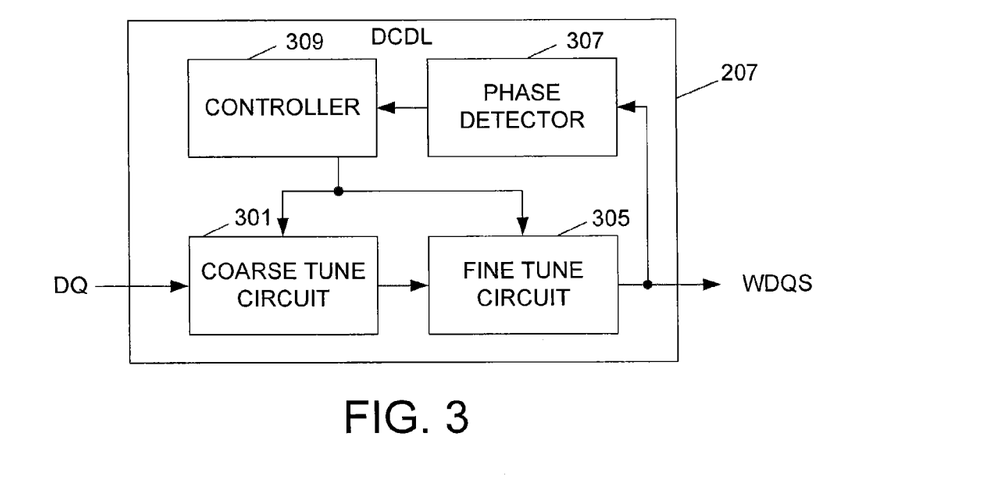
FIG. 3 is a block diagram of a digitally controlled delay line in accordance with various embodiments of the present disclosure.

FIG. 3 illustrates DCDL 207 in accordance with various embodiments of the present disclosure. DCDL 207 includes a coarse tune circuit 301, which receives input digital signal DQ. Coarse tune circuit 301 is configured to delay digital signal DQ in coarse increments. The coarse delayed signal produced by coarse tune circuit 301 is received by a fine tune circuit 305. Fine tune circuit 305 is configured to delay the signal received from coarse tune circuit 301 in fine increments of, for example, 5.5 pico-seconds, thereby producing time-delay clock signal WDQS. DCDL 207 is internally controlled by a phase detector 307 and a controller 309. As will be described in detail hereinafter, the amount of delay in signal WDQS is controlled by an external controller.

Figure 4:
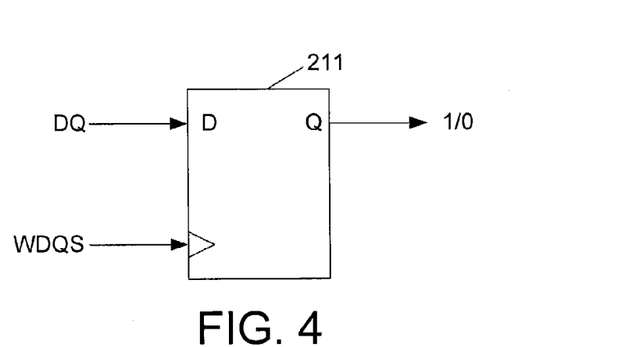
FIG. 4 is a block diagram of an edge detect circuit in accordance with various embodiments of the present disclosure.

FIG. 4 illustrates edge detect circuit (EDC) 211 in accordance with various embodiments of the present disclosure. In FIG. 4, EDC 211 is a D flip-flop, which receives digital signal DQ at its D input and time-delayed clock signal WDQS at its clock input. As is known to those skilled in the art, a D flip-flop outputs a logical 1 or 0 according to the voltage of signal DQ its D input at the instant a rising edge is detected at its clock input. However, signal DQ must be stable for a minimum time, known as the setup time, before the rising edge of clock signal WDQS.

Figure 5:
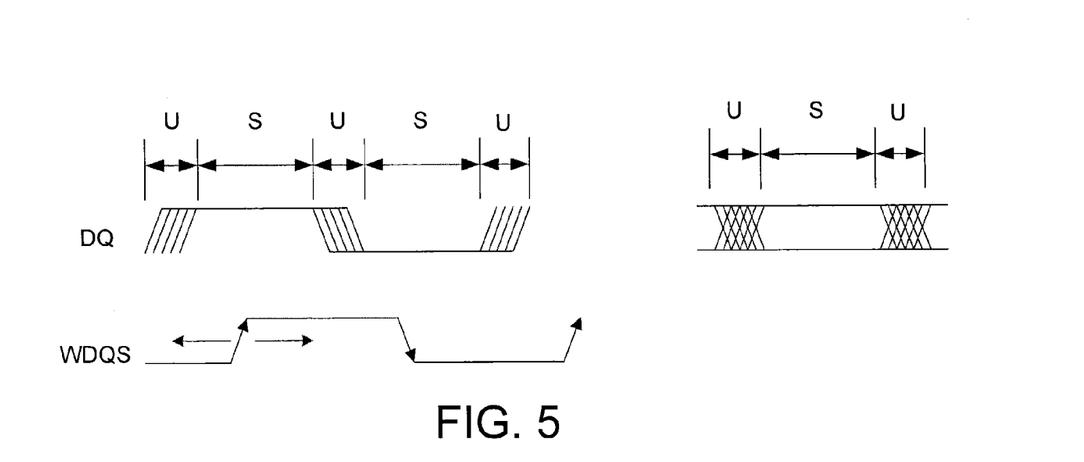
FIG. 5 is a schematic illustration of eye width timing determination in accordance with various embodiments of the present disclosure.

FIG. 5 illustrates the operation of EDC 211. Successive rising and filing edges of digital signal DQ tend not to be in identical lock step. Rather, the rising and falling edges of signal DQ tend to wander, which creates unstable regions U. Between unstable regions U, digital signal DQ is stable in either its high or low state in stable regions S. Clock signal WDQS is controlled to move back and forth time-wise, as indicated by dashed lined arrows, so that EDC 211 captures the high or low state of signal DQ in stable regions S. The time-wise length of stable region S defines the width of the captured eye diagram.

Figure 6:
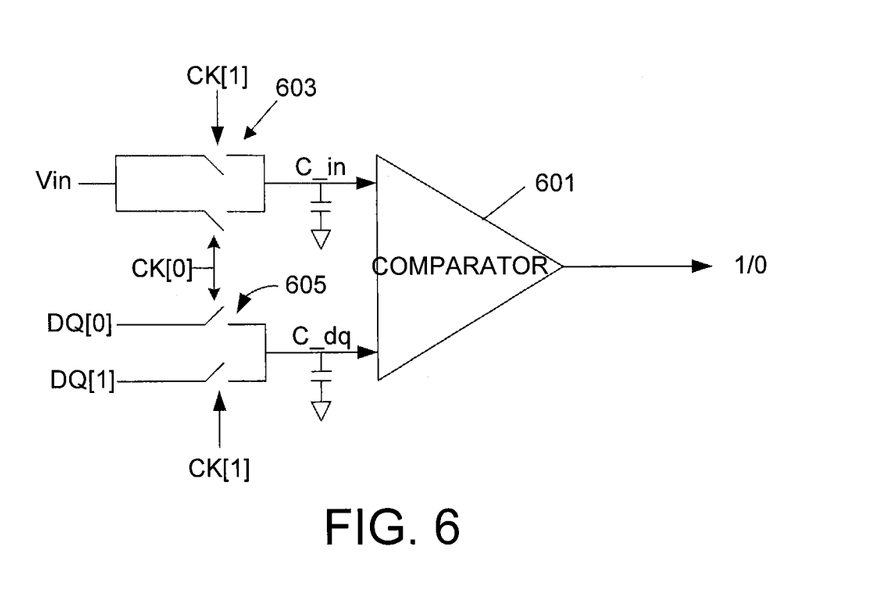
FIG. 6 is a block diagram of a voltage comparator circuit for determining eye height in accordance with various embodiments of the present disclosure.

FIG. 6 illustrates the voltage threshold comparator (VTC) 213, which includes a comparator 601, in accordance with various embodiments of the present disclosure. Comparator 601 compares a reference voltage C_in with a voltage C_dq. Comparator 601 outputs a logic 1 signal if C_in and C_dq are equal to each other. Comparator 601 outputs a logic 1 signal if C_in and C_dq are not equal to each other. Accordingly, comparator 601 determines the voltage of signal C_dq.

Figure 7:
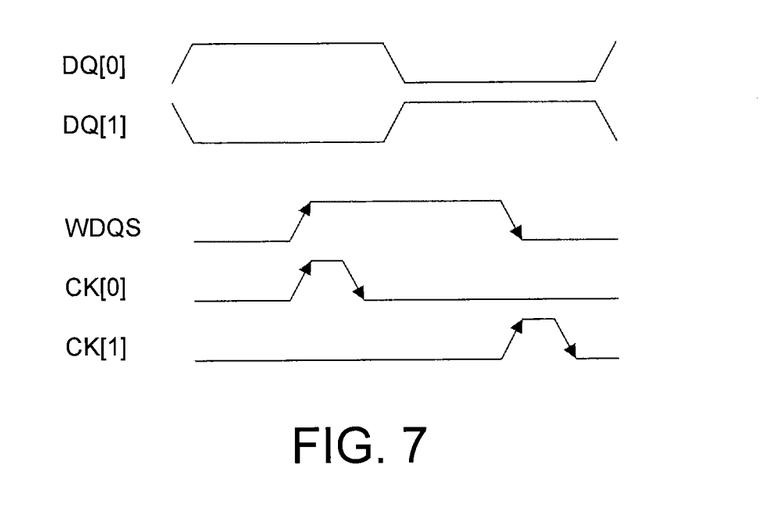
FIG. 7 is a schematic illustration of an example of inputs to the voltage comparator circuit of FIG. 6.

Reference voltage C_in is supplied from a voltage source Vin through a set of switches 603. Voltage Vin may be supplied by automate test equipment through analog IOPADs. Switches 603 are operated by clock signals CK[0] and CK[1]. As shown in FIG. 7, clock signals CK[0] and CK[1] are related to time-delayed clock signal WDQS. More particularly, clock signal CK[0] corresponds to a rising edge of signal WDQS and clock signal CK[1] corresponds to a falling edge of signal WDQS.

Voltage C_dq is supplied from signals DQ[0] and DQ[1] through a set of switches 605, which are operated by clock signals CK[0] and CK[1]. As shown in FIG. 7, signal DQ[0] is signal DQ and signal DQ[1] is inverted signal DQ. As will be described in detail hereinafter, input voltage Vin and time-delayed clock signal WDQS are swept to capture eye height.

Figure 8:
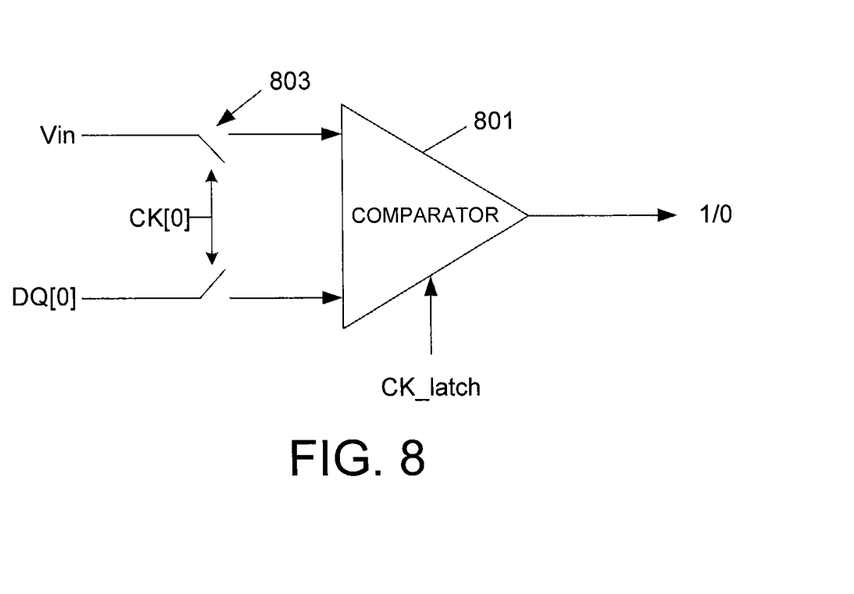
FIG. 8 is a block diagram of a voltage comparator circuit for determining eye height in accordance with various embodiments of the present disclosure.

FIG. 8 illustrates a second embodiment of voltage threshold comparator (VTC) 213, which includes a comparator 801. Comparator 801 compares reference voltage Vin, described above with reference to FIG. 6, with the voltage of signal DQ[0]. As described above with reference to FIG. 6, signal DQ[0] is the same signal DQ.

Figure 9:
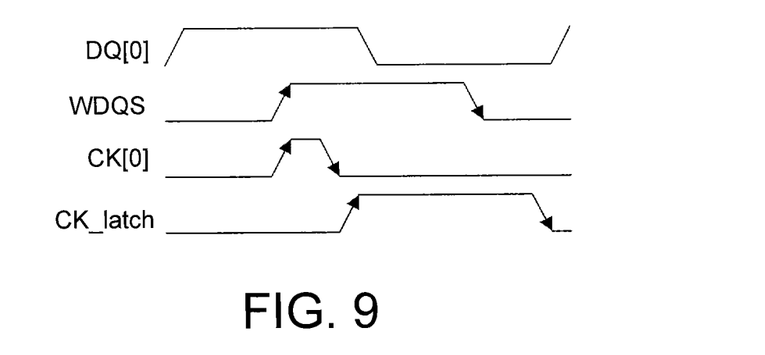
FIG. 9 is a schematic illustration of an example of inputs to the voltage comparator circuit of FIG. 8.

Reference voltage Vin and digital signal DQ[0] are supplied to comparator 801 through a pair of switches 803 operated by clock signal CK[0], which is described above with respect to FIGS. 6 and 7. Comparator 803 is latched by a signal CK_latch. As shown in FIG. 9, CK_latch is generated from time-delayed clock signal WDQS, with its rising edge starting immediately behind the falling edge of clock signal CK[0]. Comparator 801 outputs a logic 1 signal if the voltages of Vin and DQ[0] are equal to each other. Accordingly, comparator 801 determines the voltage of signal DQ. As will be described in detail hereinafter, input voltage Vin and time-delayed clock signal WDQS are swept to capture eye height.

Figure 10:
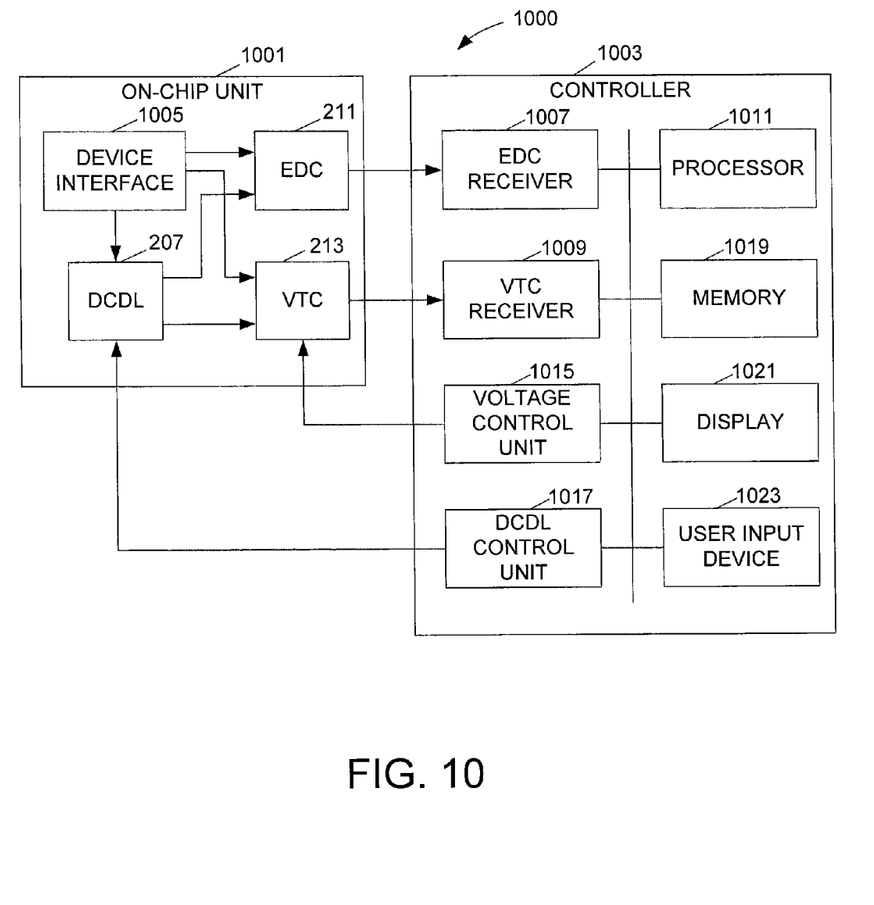
FIG. 10 is a block diagram of an on-chip eye diagram capture system in accordance with various embodiments of the present disclosure.

FIG. 10 is a block diagram of an eye capture system 1000 in accordance with various embodiments of the present disclosure. System 1000 includes an on-chip unit 1001 and a controller 1003. On-chip unit 1001 includes a device interface 1005 for receiving digital signal DQ from the device under test. Device interface outputs signal DQ to DCDL 207, EDC 211, and VTC 213, as described above. DCDL 207 outputs time-delayed clock signal WDQS to EDC 211 and VTC 213.

Controller 1003 includes an EDC receiver 1007, which is connected to receive the output signal from EDC 211. Controller 1003 also includes a VTC receiver 1009, which is connected to receive the output signal from VTC 213. EDC receiver 1007 and VTC receiver are connected to a processor 1011, which performs processing and control functions, by a bus 1013. Processor 1011 controls a voltage control unit 1015, which provides voltage control signals to VTC 213. Processor 1011 also controls a DCDL control unit 1017, which provides timing delay control signals to DCDL 213. Controller 1003 also includes memory 1019 for storing programming instructions and data under control of processor 1011. Controller may include a display 1021 and a user input device 1023.

Figure 11:
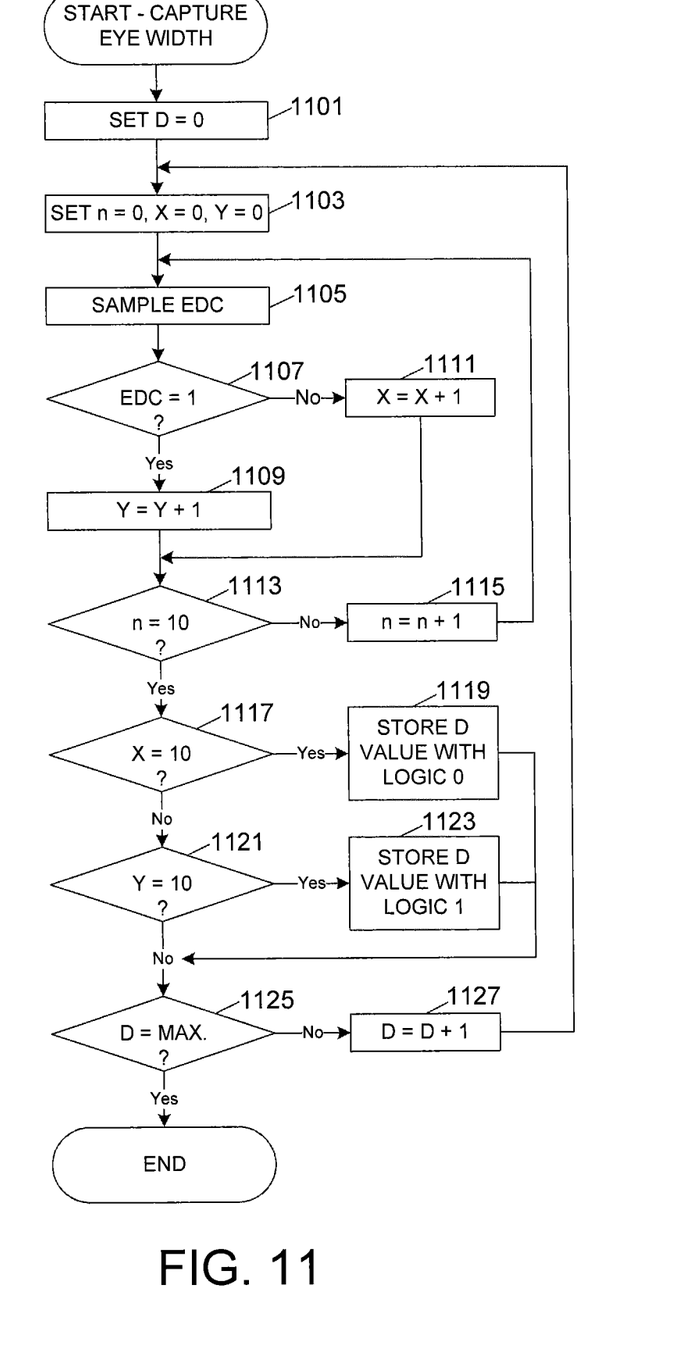
FIG. 11 is a flow chart of eye width capture processing in accordance with various embodiments of the present disclosure.

FIG. 11 is a flowchart of eye width capture processing in accordance with various embodiments of the present disclosure. Initially, the timing delay D of DCDL 207 is set to zero, at block 1101. Next, constants n, X and Y are set to zero, at block 1103, where n is the number of times EDC 211 is sampled at a particular timing delay D, X is the number of logical zeros sampled by EDC 211 at the particular timing delay D, and Y is the number of logical ones sampled by EDC 211 at the particular timing delay D. After initialization, the system samples the EDC value, at block 1105. If, as determined at the sampled value of EDC 211 is logical one, the system increments Y, at block 1109. If, as determined at the sampled value of EDC 211 is logical zero, the system increments X, at block 1109. Then, the system determines, at decision block 1113, if n is equal to 10. If n is determined to be not equal to 10, the system increments n, at block 1115, and processing returns to block 1105. Thus, the system samples EDC 211 ten times for each timing delay D.

When the system determines, decision block 1113, that n=10, the system determines at decision block 1117, if X (the number of logic zeros sampled) is equal to 10. If X is equal to 10, the system stores the value of time delay D with logic value 0 for use in connection with the eye height capture to be described with reference to FIG. 12, as indicated at block 1119. If X is not equal to 10, the system determines, at decision block 1121, if Y (the number of logic ones sampled) is equal to 10. If Y is equal to 10, the system stores the value of time delay D with logic value 1, as indicated at block 1123. After storing the time delay D, at blocks 1119 or 1123, or if neither X nor Y is determined to be equal 10, which indicates that output of EDC 211 is unstable at time delay D, the system determines, at decision block 1125, if time delay D is equal to a maximum value. If time delay D is not equal to the maximum value, the system increments D by one fine tuning increment (e.g. 5.5 pico-seconds), and processing returns to block 1103. If time delay D is equal to the maximum value, eye width capture processing ends. Thus, eye width capture processing according to FIG. 11, determines a stable region where the output of EDC 211 is constant at logic 1 or logic 0 between a stable region start time T_start and a stable region end time T_end.

Figure 12:
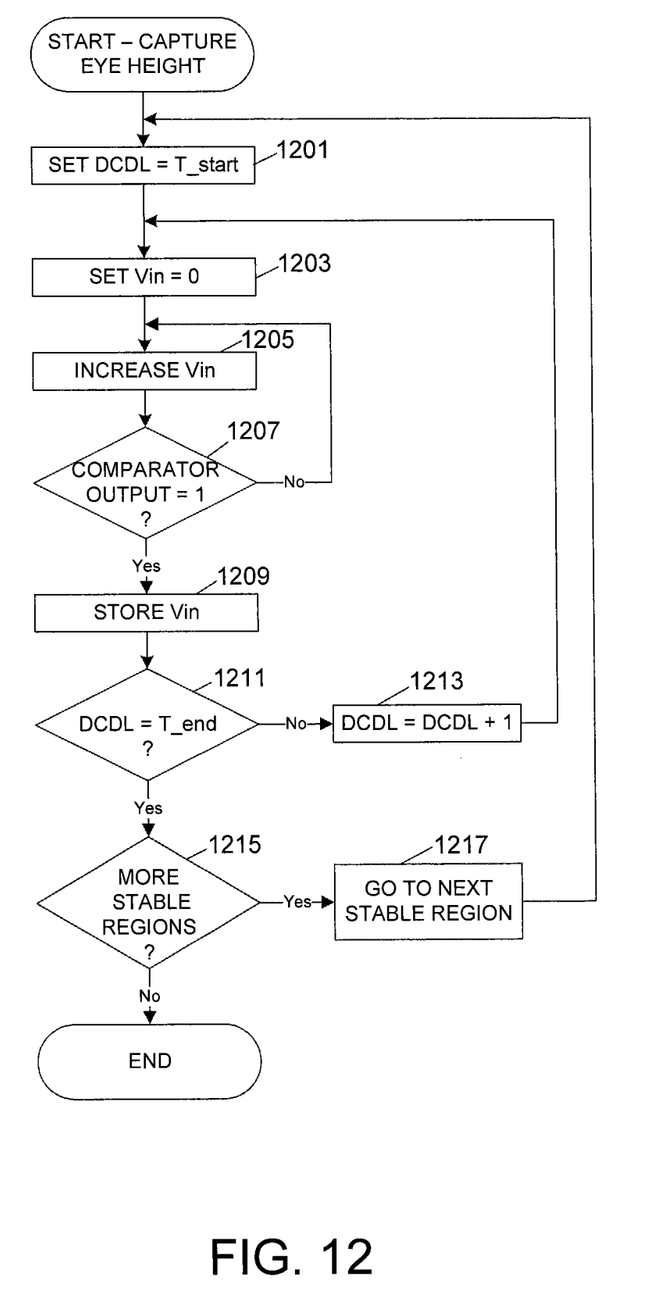
FIG. 12 is a flow chart of eye height capture processing in accordance with various embodiments of the present disclosure.

FIG. 12 is a flowchart of eye height capture processing in accordance with various embodiments of the present disclosure. Initially, the system sets the delay of DCDL 207 to a stable region start time T_start, at block 1201. Then, the system sets reference voltage Vin to zero, at block 1303. After initialization, the system starts to increase reference voltage Vin, at block 1203, and tests, at decision block 1207, whether or not the output of VTC 213 equal to one. When the system determines that the output of VTC 213 is equal to one, which indicates that Vin is equal to DQ at the set of DCDL 207, the system stores the value of Vin with the time delay setting of DCDL 207, at block 1209. Then, the system determines, at decision block 1211, if the time delay setting of DCDL 207 is equal to the stable region end time T_end. If the time delay setting is not T_end, the system increments the DCDL setting, at block 1213, and processing returns to block 1203. If the time delay setting is equal to T_end, the system determines, at decision block 1215, if there are more stored stable regions. If there are more stored stable regions, processing goes to the next stored stable region, at block 1217, then returns to block 1201. If there are no more stored stable regions, the eye height capture processing ends.

Figure 13:
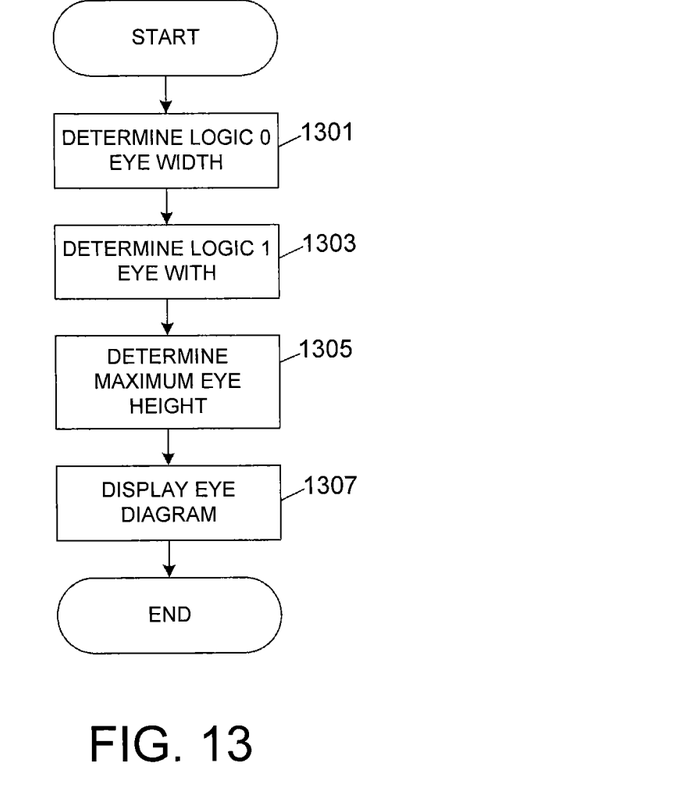
FIG. 13 is a flow chart of eye diagram processing in accordance with various embodiments of the present disclosure.

FIG. 13 is a flowchart of eye diagram display processing in accordance with various embodiments of the present disclosure. The system determines a logic 0 eye width, at block 1301. In some embodiments, the determination includes finding a mean value for all stored logic 0 stable regions. Then, the system determines a logic 1 eye width, at block 1303. Again, the determination includes finding a mean value for all stored logic 1 stable regions. After having determined the logic 0 and logic 1 eye widths, the system determines a maximum stored eye height, at block 1305. Having determined the mean logic 0 and logic 1 eye widths and the maximum eye height, the system displays the eye diagram, as indicated at block 1307. The displayed eye diagram can be used to analyze the quality of the signal produced by the device being tested. For example, the displayed eye diagram can be compared to an eye mask to determine of the device being tested passes of fails the test.

In some embodiments, an eye diagram capture device comprises a delay line arranged to receive a digital signal and output time a delayed version of the digital signal, an edge detection circuit arranged to receive the digital signal and the time delayed version of the digital signal, the edge detection circuit operating to output a signal corresponding to a logical value of the digital signal received coincident with an edge of the time delay version of the digital signal, and a voltage comparator arranged to receive the digital signal and a reference voltage, the voltage comparator operating to output a first signal when the a voltage of the digital signal and the reference voltage are equal to each other.

In some embodiments, edge detection circuit comprises a D flip-flop having a D input and a clock input, wherein the digital signal is applied to the D input and the time delayed version of the digital signal is applied to the clock input.

In some embodiments, the delay line is arranged to provide controllable time delays.

In some embodiments, the delay line comprises a digitally controlled delay line.

In some embodiments, the voltage comparator is operated to compare the reference voltage and the digital signal voltage by a clock signal that is related to a rising edge of the time delayed version of the digital signal.

In some embodiments, the voltage comparator is operated to compare the reference voltage and the digital signal voltage by a clock signal that is related to a falling edge to the time delayed version of the time delayed version of the digital signal.

In some embodiments, including a phase-locked loop arranged to receive the digital signal and provide the digital signal to the delay line.

In some embodiments, the delay line is positioned on a first chip, and the edge detect circuit and the voltage comparator are positioned on a second chip.

In some embodiments, the first and second chips are mounted on a wafer.

In some embodiments, a system for capturing an eye diagram comprises a capture device, including a delay line arranged to receive a digital signal and output time delayed version of the digital signal, an edge detection circuit arranged to receive the digital signal and the time delayed version of the digital signal, the edge detection circuit operating to output a signal corresponding to a logical value of the digital signal received coincident with an edge of the time delay copy of the digital signal, and, a voltage comparator arranged to receive the digital signal and a reference voltage, the voltage comparator operating to output a first signal when the a voltage of the digital signal and the reference voltage are equal to each other, and a controller, including an edge detection circuit receiver connected to receive the output signal from the edge detection circuit, delay line control unit connected to provide a delay time control signal to the delay line, a voltage comparator receiver connected to receive the first signal from the voltage comparator, and a voltage control unit connected to provide controlled voltage to the voltage comparator.

In some embodiments, the controller further includes a processor coupled to the edge detection circuit receiver, the voltage comparator, the voltage control unit, and the delay line control unit, and wherein the processor is configured to determine an eye width based on signals received from the edge detection circuit and an eye height based upon signals received from the voltage comparator.

In some embodiments, the processor is configured to operate the delay line control unit and the voltage control unit.

In some embodiments, the processor is configured to operate the delay line control unit to sweep, from minimum delay time to a maximum delay time, the delay of a digital signal to generate time delayed digital signals, use the delayed digital signals to capture logic values of the digital signal; store delay times corresponding to captured logic values, and use the stored delay times to determine an eye width.

In some embodiments, the processor is further configured to operate the voltage control unit to sweep the reference voltage input to the comparator from a first voltage level to a second voltage level for each stored delay time, store for each stored delay time the reference voltage level that is equal to the voltage level of the compared digital signal, and use the stored reference voltage levels to determine an eye height.

In some embodiments, a maximum stored reference value is equal to the eye height.

In some embodiments, a method of generating an eye diagram comprises sweeping, from a minimum delay time to a maximum delay time, a delay of a digital signal received from a device to generate time delayed digital signals, using the delayed digital signals to capture logic values of the digital signal, storing delay times corresponding to captured logic values, and using the stored delay times to determine an eye width.

In some embodiments, the method further comprises sweeping a reference voltage from a first voltage level to a second voltage level for each stored delay time, comparing a voltage level of the digital signal corresponding to the each stored delay time to the reference voltage level, storing for each stored delay time a reference voltage level that is equal to the voltage level of the compared digital signal, and using the stored reference voltage levels to determine an eye height.

In some embodiments, storing includes determining a start time corresponding to a transition from an unstable logic value to a stable logic value, determining an end time corresponding to a transition from the stable logic value to the unstable logic value, and storing the delay times between the start time and the end time.

In some embodiments, the eye width is determined from the start time and the end time.

In some embodiments, the method further comprises sweeping a reference voltage from a first voltage level to a second voltage level for each stored delay time between the start time and the end time, comparing a voltage level of the digital signal corresponding to the each stored delay time between the start time and end time to the reference voltage level, storing for each stored delay time between the start time and the end time a reference voltage level that is equal to the voltage level of the compared digital signal, and determining a maximum stored reference voltage level, the maximum stored reference voltage level corresponding an eye height.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

The above-described embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

While preferred embodiments of the present subject matter have been described, it is to be understood that the embodiments described are illustrative only and that the appended claims shall be accorded a full range of equivalents, many variations and modifications naturally occurring to those of skill in the art from a perusal hereof.

What is claimed is:

1. An eye diagram capture device, which comprises:
   a delay line arranged to receive a digital signal and output a time delayed version of the digital signal;
   an edge detection circuit arranged to receive the digital signal and the time delayed version of the digital signal, the edge detection circuit operating to output a signal corresponding to a voltage of the digital signal received, which is stable before a leading edge of the time delayed version of the digital signal; and,
   a voltage comparator arranged to receive the digital signal and a reference voltage, the voltage comparator operating to output a first signal when the voltage of the digital signal and the reference voltage are equal to each other.

2. The eye diagram capture device as claimed in claim 1, wherein the edge detection circuit comprises a D flip-flop having a D input and a clock input, wherein the digital signal is applied to the D input and the time delayed version of the digital signal is applied to the clock input.

3. The eye diagram capture device as claimed in claim 1, wherein the delay line is arranged to provide controllable time delays.

4. The eye diagram capture device as claimed in claim 3, wherein the delay line comprises a digitally controlled delay line.

5. The eye diagram capture device as claimed in claim 1, wherein the voltage comparator is operated to compare the reference voltage and the digital signal voltage by a clock signal that is related to a rising edge to the time delayed version of the time delayed version of the digital signal.

6. The eye diagram capture device as claimed in claim 1, wherein the voltage comparator is operated to compare the reference voltage and the digital signal voltage by a clock signal that is related to a falling edge to the time delayed version of the time delayed version of the digital signal.

7. The eye diagram capture device as claimed in claim 1, including a phase-locked loop arranged to receive the digital signal and provide the digital signal to the delay line.

8. The eye diagram capture device as claimed in claim 1, wherein:
the delay line is positioned on a first chip; and,
the edge detect circuit and the voltage comparator are positioned on a second chip.

9. The eye diagram capture device as claimed in claim 8, wherein the first and second chips are mounted on a wafer.

10. A method to capture an eye diagram, comprising:
receiving a digital signal and output a time delayed version of the digital signal via a delay line;
receiving the digital signal and the time delayed version of the digital signal via edge detection circuit and outputting a signal corresponding to a voltage of the digital signal received, which is stable before a leading edge of the time delayed version of the digital signal via an edge detection circuit;
receiving the digital signal and a reference voltage and outputting a first signal when the a voltage of the digital signal and the reference voltage are equal to each other via a voltage comparator.

11. The method as claimed in claim 10, further comprising:
applying the digital signal to a D input of a D flip-flop and the time delayed version of the digital signal to a clock input of the D flip-flop.

12. The method as claimed in claim 10, further comprising:
arranging the delay line to provide controllable time delays.

13. The method as claimed in claim 12, wherein the delay line comprises a digitally controlled delay line.

14. The method as claimed in claim 10, further comprising:
comparing the reference voltage and the digital signal voltage by a clock signal that is related to a rising edge to the time delayed version of the time delayed version of the digital signal.

15. The method as claimed in claim 10, further comprising:
comparing the reference voltage and the digital signal voltage by a clock signal that is related to a falling edge to the time delayed version of the time delayed version of the digital signal.

16. The method as claimed in claim 10, further comprising:
receiving the digital signal and providing the digital signal to the delay line.

17. The method as claimed in claim 10, wherein:
the delay line is positioned on a first chip; and,
the edge detect circuit and the voltage comparator are positioned on a second chip.

18. The method as claimed in claim 17, wherein the first and second chips are mounted on a wafer.

* * * * *